(12) United States Patent
Watanabe

(10) Patent No.: US 7,339,152 B2
(45) Date of Patent: *Mar. 4, 2008

(54) DELAY CIRCUIT AND TEST APPARATUS

(75) Inventor: Daisuke Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 633 days.

This patent is subject to a terminal disclaimer.

(21) Appl. No.: 10/887,760

(22) Filed: Jul. 9, 2004

(65) Prior Publication Data

US 2004/0251401 A1 Dec. 16, 2004

Related U.S. Application Data

(63) Continuation of application No. PCT/JP03/00093, filed on Jan. 9, 2003.

(30) Foreign Application Priority Data

Jan. 9, 2002 (JP) .............................. 2002-002349

(51) Int. Cl.
*H01J 40/14* (2006.01)
*G01J 1/34* (2006.01)

(52) U.S. Cl. .............................. 250/214 R; 250/214 C

(58) Field of Classification Search ............ 250/214 R, 250/214 C; 359/279
See application file for complete search history.

(56) References Cited

U.S. PATENT DOCUMENTS

| 5,563,898 | A | | 10/1996 | Ikeuchi et al. |
| 5,790,244 | A | * | 8/1998 | Dunne ........................ 356/5.01 |
| 5,889,583 | A | * | 3/1999 | Dunne ........................ 356/5.01 |
| 6,275,084 | B1 | * | 8/2001 | McAdams ................... 327/329 |
| 7,119,939 | B2 | * | 10/2006 | Watanabe ................... 359/279 |

FOREIGN PATENT DOCUMENTS

| JP | 59-28718 | 2/1984 |
| JP | 62-81073 | 4/1987 |

(Continued)

OTHER PUBLICATIONS

Patent Abstract of Japan, Publication No. 62-081073, Publication Date Apr. 14, 1987, 2 pages.

(Continued)

*Primary Examiner*—John R. Lee
(74) *Attorney, Agent, or Firm*—Osha Liang LLP

(57) ABSTRACT

A delay circuit for delaying an input signal with a desired delay and outputting the delayed signal. The delay circuit includes a light emitting element for emitting light according to an input signal and outputting a delay signal, a bias current source for supplying in advance a first light emitting element with a bias current smaller than a light emission threshold current of the first light emitting element, a bias current controller for controlling the bias current according to a desired delay time, a modulation current source for supplying the light emitting element with a modulation current for making the light emitting element emit light in accordance with the input signal, and a modulation current controller for controlling the modulation current in accordance with a delay resolution in the delay circuit. The modulation current controller controls the modulation current further according to a variable delay range in the delay circuit.

13 Claims, 9 Drawing Sheets

FOREIGN PATENT DOCUMENTS

JP    6-181351    6/1994
JP    8-226957    9/1996

OTHER PUBLICATIONS

Decision for Final Rejection issued in Japanese Application No. 2002-002349 mailed on Jul. 25, 2006 and English translation thereof, 4 pages.

Patent Abstracts of Japan, Publication No. 59-028718 dated Feb. 15, 1984, 1 pg.

Patent Abstracts of Japan, Publication No. 06-181351 dated Jun. 28, 1994, 1 pg.

Patent Abstracts of Japan, Publication No. 08-226957 dated Sep. 3, 1996, 1 pg.

International Search Report mailed Apr. 30, 2003 in PCT Application No. WO 03/061126, 3 pgs.

* cited by examiner

| LIGHT EMITTING ELEMENT | DELAY RESOLUTION | PROPER DELAY RANGE |
|---|---|---|
| 32a | 0.02ns | 0.0~0.2ns |
| 32b | 0.04ns | 0.2~0.4ns |
| ⋮ | ⋮ | ⋮ |

FIG. 8

DELAY CIRCUIT AND TEST APPARATUS

The present application is a continuation application of PCT/JP03/00093 filed on Jan. 9, 2003 which claims priority from a Japanese Patent Application No. 2002-002349 filed on Jan. 9, 2002, the contents of which are incorporated herein by reference.

FIELD OF THE INVENTION

The present invention relates to a delay circuit for delaying an input signal by a desired time and a test apparatus for testing an electronic device. More particularly, the present invention relates to a delay circuit using a light emitting element.

RELATED ART

A conventional test apparatus for testing an electronic device such as a semiconductor device is provided with a delay circuit for delaying a test signal by a desired time. The delay circuit is a variable delay circuit capable of changing the delay time to a desired time and controlling the delay time based on the information stored in, e.g. a linearization memory.

The delay circuit, which has a plurality of delay elements, generates a desired delay time by passing the input signal to one of the delay elements based on a delay setting value and the information stored in the linearization memory. The delay element consists of electric circuit elements such as buffers.

As the electronic device recently becomes highly precise and speedy, however, the test apparatus and the delay circuit for the test of the electronic device also need to be so. Nevertheless, the delay circuit and the test apparatus using the conventional electric circuit elements almost reach the limitation of being higher precise and speedy, so a delay circuit using new means is desired. Further in the configuration of a highly precise delay circuit, it is difficult to realize the variable delay in which linearity is extremely excellent.

SUMMARY OF THE INVENTION

Accordingly, it is an object of the present invention to provide a delay circuit and a test apparatus, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a delay circuit for outputting a delay signal, which results from delaying an input signal as much as a desired time, includes a first light emitting element for emitting light according to the input signal and outputting a light emission signal as the delay signal and a first bias current source for supplying in advance the first light emitting element with a bias current, which is smaller than a light emission threshold current whereby the first light emitting element starts to emit light.

According to the second aspect of the present invention, a test apparatus for testing an electronic device includes a pattern generator for generating a test signal to test the electronic device, a waveform formatter for supplying the electronic device with a signal, which results from formatting the test signal, a timing generator for generating a desired timing signal, a sampler for sampling an output signal outputted by the electronic device based on the test signal at the timing of the desired timing signal generated by the timing generator, and a judgment unit for judging quality of the electronic device based on a sampling result of the sampler, wherein the timing generator includes a reference clock generator for generating a reference clock and a delay circuit for outputting a delay signal, which results from delaying the reference clock as much as a desired time, as the desired timing signal, and the delay circuit includes a first light emitting element for emitting light according to the reference clock and outputting a light emission signal as the delay signal and a bias current controller for supplying in advance the light emitting element with a bias current, which is smaller than a light emission threshold current whereby the light emitting element starts to emit light.

The summary of the invention does not necessarily describe all necessary features of the present invention. The present invention may also be a sub-combination of the features described above.

BRIEF DESCRIPTION OF DRAWINGS

FIG. 8 shows an example of a characteristics table.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
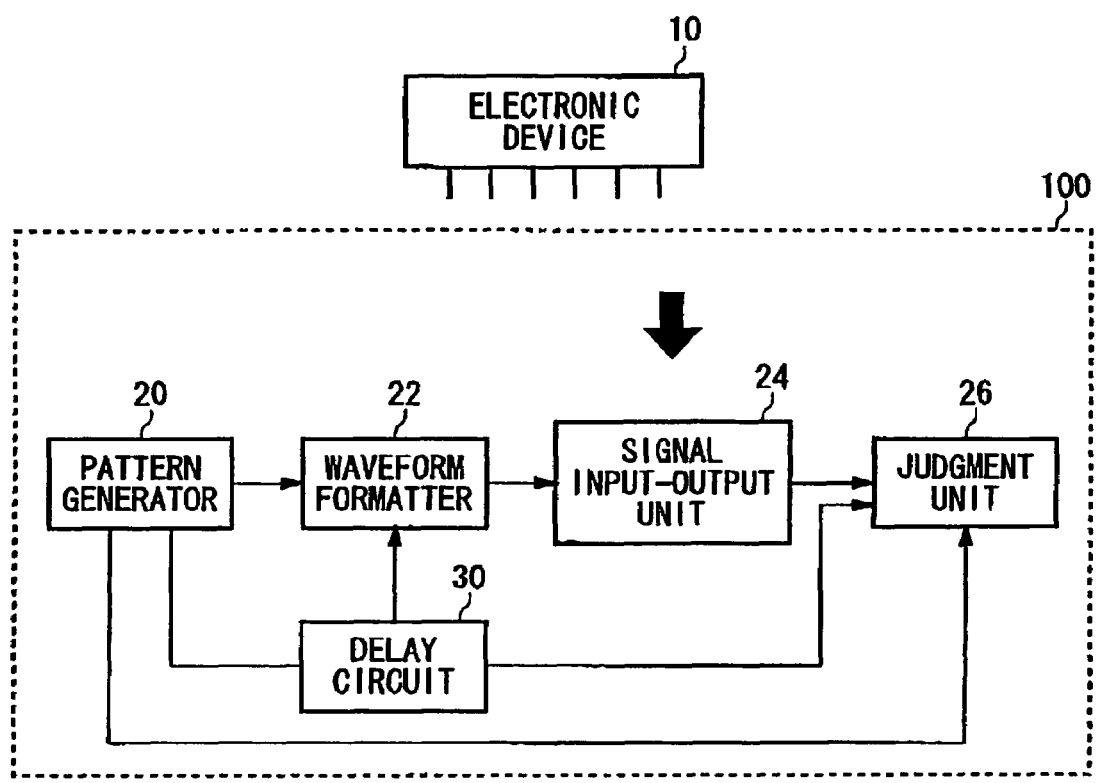
FIG. 1 shows an example of the configuration of a test apparatus related to this invention.

FIG. 1 shows an example of the configuration of a test apparatus 100 related to this invention. The test apparatus 100 tests an electronic device 10. The test apparatus 100 is provided with a pattern generator 20, a waveform formatter 22, a delay circuit 30, a signal input-output unit 24, and a judgment unit 26. The pattern generator 20 generates a test signal for the test of the electronic device 10 and supplies it to the waveform formatter 22 or the delay circuit 30.

The delay circuit 30 delays an input signal by a desired time. In this embodiment, the delay circuit 30 delays the test signal received from the pattern generator 20 as much as a desired time and supplies it to the waveform formatter 22. The delay circuit 30 which is a variable delay circuit may delay the test signal based on a test pattern for the test of the electronic device 10.

The waveform formatter 22 formats the test signal received and supplies the test signal formatted to the electronic device 10 via the signal input-output unit 24. The signal input-output unit 24 supplies the test signal to the electronic device 10 and receives the output signal outputted by the electronic device 10 based on the test signal. The signal input-output unit 24 supplies the output signal received to the judgment unit 26.

The judgment unit 26 judges the quality of the electronic device 10 based on the output signal outputted by the electronic device 10 according to the test signal. The judgment unit 26 may judge the quality of the electronic device 10 by comparing an expected signal to be outputted by the electronic device 10 based on the test signal and the output signal outputted by the electronic device 10. In this case, the pattern generator 20 may generate the expected signal based on the test signal generated and supply it to the judgment unit 26.

And the delay circuit 30 may generate a desired timing signal and supply the timing signal to the judgment unit 26. In other words, the delay circuit 30 may be a timing generator. For example, the delay circuit 30 may receive a reference clock and generate a desired timing signal based on the reference clock received. The judgment unit 26 may sample the output signal of the electronic device 10 at the timing based on the timing signal and judge the quality of the electronic device 10 based on the sampling result.

Figure 2:
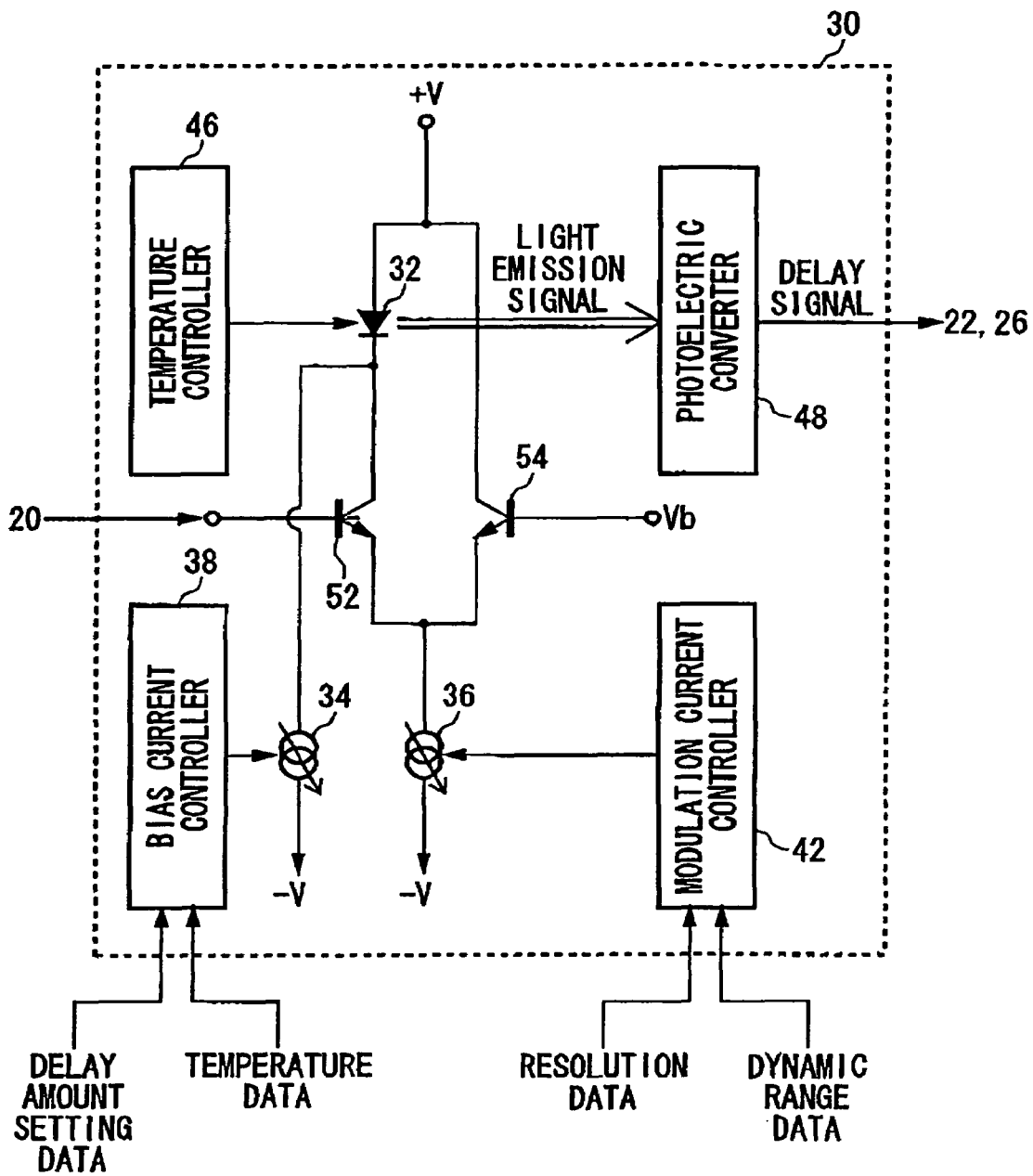
FIG. 2 shows an example of the configuration of a delay circuit.

FIG. 2 shows an example of the configuration of the delay circuit 30. The delay circuit 30 outputs a delay signal which results form delaying the input signal by a desired time. In this embodiment, the delay circuit 30 receives the test signal as the input signal and supplies the delay signal, which results from delaying the test signal as much as a desired time, to the signal input-output unit 24 as the test signal. In another example, the delay circuit 30 may receive the reference clock as the input signal and supply the delay signal, which results from delaying the reference clock by a desired time, to the judgment unit 26 as the desired timing signal. The delay circuit 30 is provided with a light emitting element 32, a bias current source 34, a modulation current source 36, a bias current controller 38, a modulation current controller 42, a temperature controller 46, a photoelectric converter 48, and transistors (52, 54).

The light emitting element 32 emits light according to the input signal and outputting a light emission signal as the delay signal. The bias current source 34 supplies a forward bias current, which is smaller than a light emission threshold current whereby the light emitting element 32 starts to emit light, to the light emitting element 32. Accordingly, the bias current caused by the bias current source 34 flows in the light emitting element 32. The amount of the bias current can be controlled in a programmable manner. The light emitting element 32 may be a laser diode.

The bias current controller 38 controls the bias current of the bias current source 34 based on the delay amount setting data indicating a desired time by which the input signal should be delayed. For example, the bias current controller 38 may receive the delay amount setting data based on the delay setting value set by a user. And the bias current controller 38 may include a bias data memory for storing the delay amount setting data and the data indicating the amount of the bias current to generate the delay amount indicated by the delay amount setting data in a corresponding manner and a digital-to-analog converter for converting the digital data stored in the bias data memory into the analog data. In this case, the bias current controller 38 controls the bias current based on the data stored in the bias data memory.

Although the light emitting element 32 emits light according to the input signal, a light emission delay caused by the light emitting element 32 occurs until the light emitting element 32 emits light from when the delay circuit 30 receives the input signal. The light emission delay time of the light emitting element 32 is determined based on the bias current flowing in the light emitting element 32 as described later in connection with FIG. 5. The bias current controller 38 controls the bias current, and thus it is possible to generate the delay signal delayed by a desired time.

And the bias current controller 38 controls the bias current of the bias current source 34 further based on the temperature data indicating the temperature of the light emitting element 32. As described later in connection with FIG. 6, the light emission delay time of the light emitting element 32 depends on the temperature of the light emitting element 32. By controlling the bias current of the bias current source 34 based on the temperature of the light emitting element 32, it is possible to reduce the error of the delay time due to the temperature change of the light emitting element 32. The bias current controller 38 controls the bias current of the bias current source 34 to be the current value resulting from multiplying the current value, which is indicated by the data of the bias data memory corresponding to the delay amount setting data, by the coefficient based on the temperature of the light emitting element 32. The bias data memory may further store the coefficient corresponding to the temperature of the light emitting element 32.

The modulation current source 36 supplies the light emitting element 32 with a forward modulation current to make the light emitting element 32 emit light according to the input signal. The modulation current source 36 is electrically coupled to the light emitting element 32 via the transistor 52. The transistor 52 receives the input signal in its base and makes the modulation current flow in the light emitting element 32 according to the input signal. In other words, the modulation current source 36 supplies the modulation current amplified from the input signal to the light emitting element 32.

The modulation current controller 42 controls the modulation current of the modulation current source 36 based on the resolution data indicating the delay resolution of the delay circuit 30. In other words, the modulation current controller 42 controls the modulation current according to the delay resolution required to the delay circuit 30. As described later in connection with FIG. 5, by controlling the modulation current flowing in the light emitting element 32, it is possible to control the resolution of the light emission delay time of the light emitting element 32. The modulation current controller 42 may include a modulation data memory for storing the current value of the modulation current in order that the current value corresponds to the delay resolution of the delay circuit 30 and a digital-to-analog converter for converting the digital data stored in the modulation data memory into the analog data.

And the modulation current controller 42 may control the modulation current of the modulation current source 36 based on the dynamic range data indicating the variable delay range of the delay circuit 30. As described later in connection with FIG. 5, by controlling the modulation current flowing in the light emitting element 32, it is possible to control the variable range of the light emission delay time of the light emitting element 32. The modulation data memory described above may store the current amount of the modulation current in order that the current amount corresponds to the variable delay range of the delay circuit 30.

The temperature controller 46 heats or cools the light emitting element 32. For example, the temperature controller 46 may heat or cool the light emitting element 32 in order to hold the temperature of the light emitting element 32 to be constant. By controlling the temperature of the light emitting element 32, it is possible to reduce the error of the delay time due to the temperature change of the light emitting element 32.

And the temperature controller 46 may heat or cool the light emitting element 32 based on the variable delay range of the delay circuit 30. By controlling the temperature of the light emitting element 32, it is possible to control the light emission threshold current of the light emitting element 32. Accordingly, as described later in connection with FIG. 6, by controlling the temperature of the light emitting element 32, it is possible to control the variable range of the light emission delay time of the light emitting element 32. The temperature controller 46 may include a temperature data memory for storing the temperature of the light emitting element 32 and the variable delay range of the delay circuit 30 in a corresponding manner and a digital-to-analog converter for converting the digital data stored in the temperature data memory into the analog data.

The transistor 54 is given a base voltage Vb at its base terminal. If the input signal of the variable delay circuit 30 is a digital signal, the base voltage Vb is preferably the voltage value indicating the intermediate level between the H and L logic levels of a digital signal. The input signal is inputted to the base terminal of the transistor 52. And the signals given to the base terminal of the transistors 52 and 54 may be differential signals based on the input signal. If the input signal to the transistor 52 indicates the H logic, the transistor 54 is in the cut-off state, the modulation current flows in the transistor 52, and the sum of the bias current and the modulation current flows in the light emitting element 32. And if the input signal indicates the L logic, the transistor 52 is in the cut-off state, the modulation current flows in the transistor 54, and the bias current flows in the light emitting element 32. As above, by performing the switching control of the current flowing in the light emitting element 32, it is possible to control the current flowing in the light emitting element 32 with higher precision.

The photoelectric converter 48 converts the light emission signal outputted by the light emitting element 32 into an electrical signal and outputs the electrical signal as the delay signal. The photoelectric converter 48 may be a circuit provided with a photodiode.

According to the delay circuit 30 as described above, by utilizing the light emission delay time of the light emitting element 32, it is possible to generate the delay with a desired time. And by controlling the bias current supplied to the light emitting element 32, the modulation current and the temperature of the light emitting element 32, it is possible to generate the delay with desired resolution and a desired variable delay range with higher precision.

Figure 3:
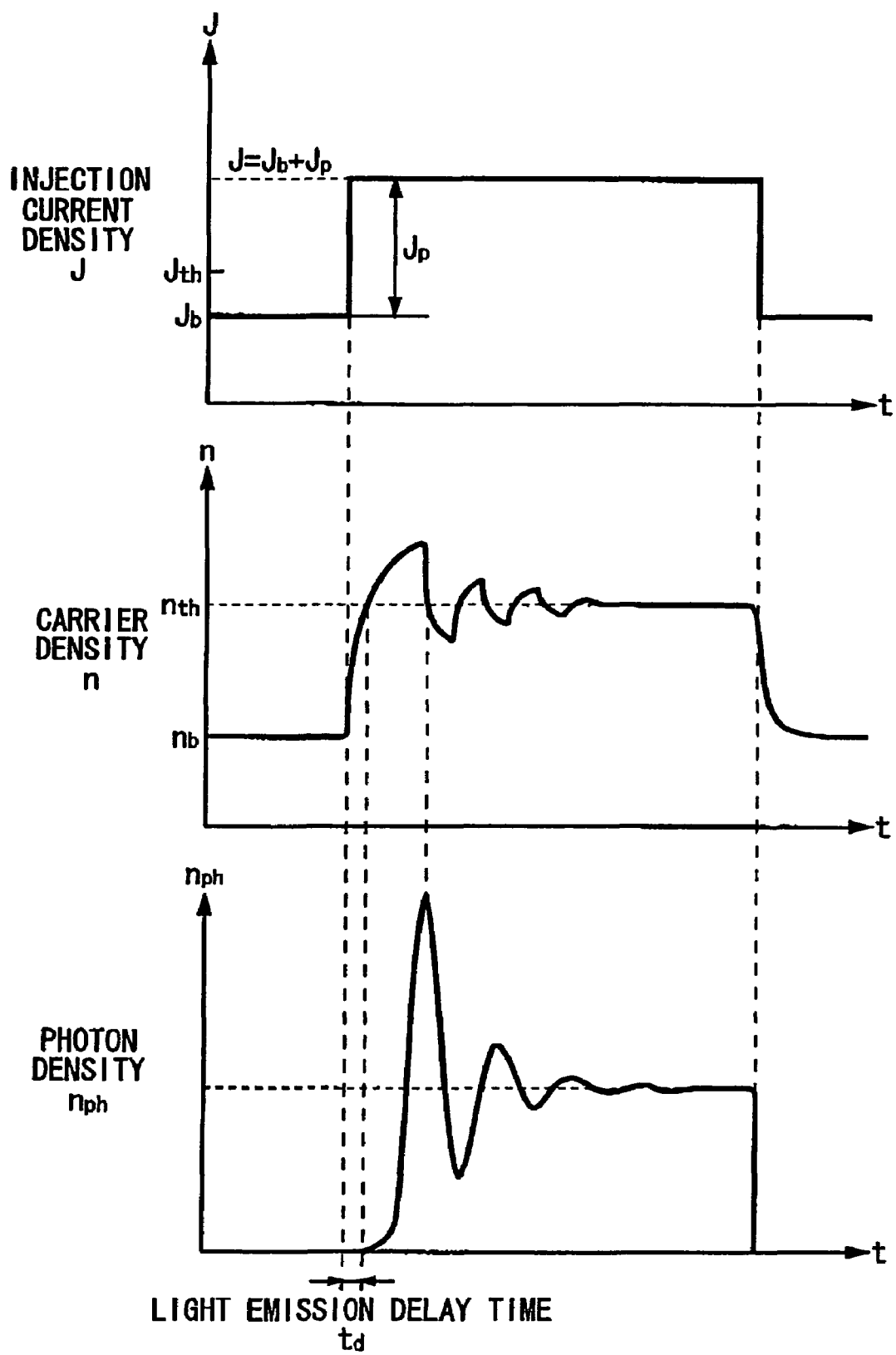
FIG. 3 shows the principle of a light emission delay time of a light emitting element.

FIG. 3 shows the principle of the light emission delay time of the light emitting element 32. In this embodiment, the light emitting element 32 is a laser diode. In FIG. 3, $J_{th}$ represents the light emission threshold current density of the light emitting element 32. As shown by the graph on top of FIG. 3, if a current of current density $J_b$, which is smaller than the light emission threshold current density $J_{th}$, flows in the light emitting element 32, the injection carrier density of the light emitting element 32 becomes $n_b$ which is smaller than the light emission threshold carrier density $n_{th}$ as shown by the graph in the middle of FIG. 3.

In this state, when the modulation current of current density $J_p$ is supplied to the light emitting element 32, the injection carrier density of the light emitting element 32 increases at the time constant $\tau_n$. When the time td lapses from when the modulation current is supplied and the injection carrier density reaches the light emission threshold carrier density $n_{th}$, the light emitting element 32 starts the laser oscillation, and the photon density starts to increase as shown in the bottom of FIG. 3. The time $t_d$ becomes the light emission delay time of the light emitting element 32.

Here, the light emission delay time $t_b$ is given by the following equation:

$$t_d = \tau_n \ln\left(\frac{J - J_b}{J - J_{th}}\right) = \tau_n \ln\left(\frac{I_p}{I_p + I_b - I_{th}}\right).$$

Where, J denotes the injection carrier density, $I_p$ denotes the modulation current, and $I_b$ denotes the light emission threshold current. As obvious from the above equation, by controlling the modulation current, the bias current, and the light emission threshold current, it is possible to control the light emission delay time of the light emitting element 32.

Figure 4:
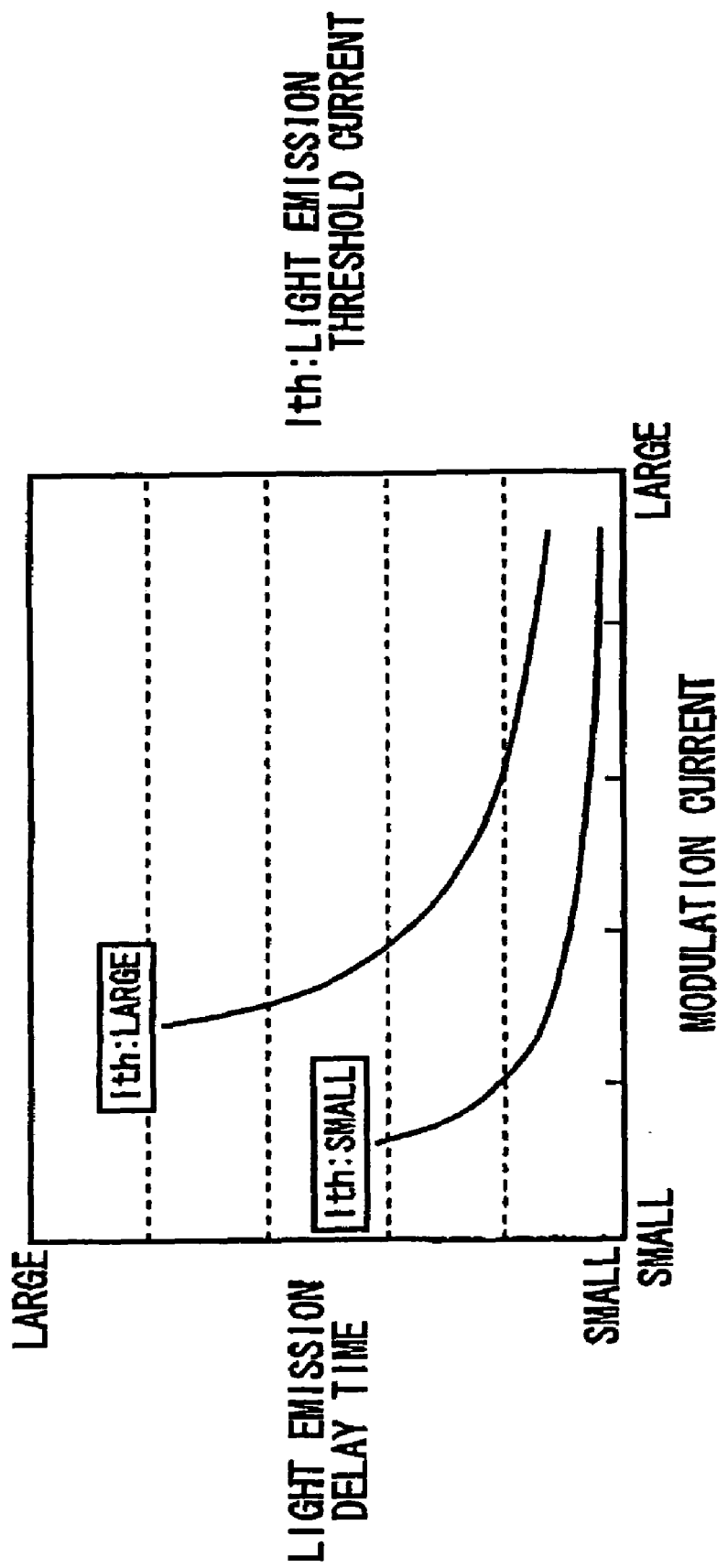
FIG. 4 shows an example of the relation between a modulation current and a light emission threshold current of the light emitting element and the light emission delay time.

FIG. 4 shows an example of the relation between the modulation current and the light emission threshold current of the light emitting element 32 and the light emission delay time. In FIG. 4, the horizontal axis represents the modulation current, and the vertical axis represents the light emission delay time. As shown in FIG. 4, if the modulation current increases, the light emission delay time of the light emitting element 32 decreases, and if the light emission threshold current $I_{th}$ increases, the light emission delay time of the light emitting element 32 increases.

Figure 5:
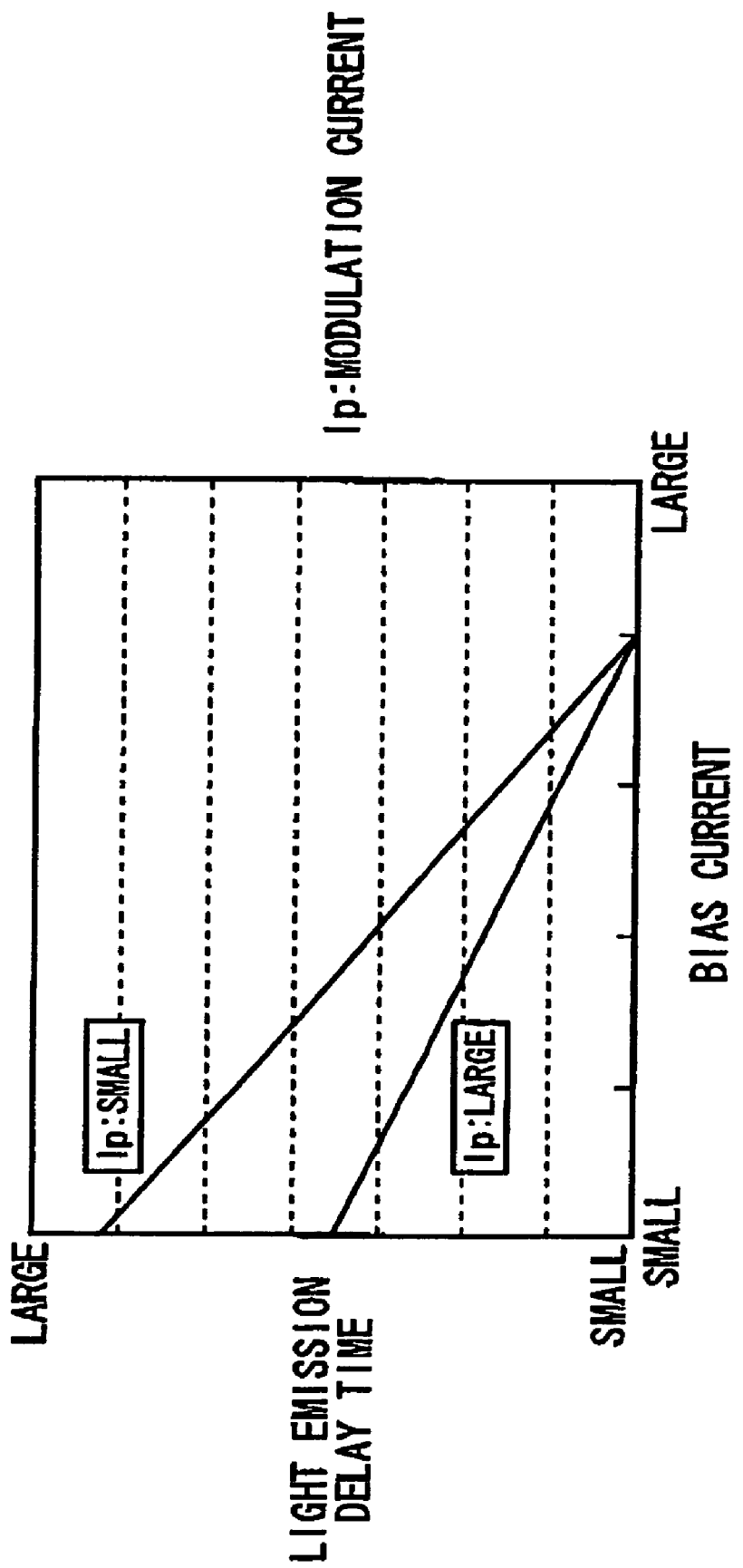
FIG. 5 shows the relation between a bias current and the modulation current of the light emitting element and the light emission delay time.

FIG. 5 shows the relation between the bias current and the modulation current of the light emitting element 32 and the light emission delay time. In FIG. 5, the horizontal axis represents the bias current, and the vertical axis represents the light emission delay time. As shown in FIG. 5, if the modulation current $I_p$ is fixed and the bias current increases, the light emission delay time of the light emitting element 32 linearly decreases.

In the delay circuit 30 described in connection with FIG. 2, the bias current is controlled and thereby the light emission delay time of the light emitting element 32 is controlled. Since the light emission delay time linearly changes to the bias current, by controlling the bias current, it is possible to control the delay time of the delay circuit 30 with high precision.

And in the delay circuit 30 described in connection with FIG. 2, the modulation current is controlled and thereby the delay resolution and the variable delay range of the light emitting element 32 is controlled. As shown in FIG. 5, if the modulation current increases, the variable delay range of the light emitting element 32 decreases. And in case that the bias current is changed with a predetermined gray scale and a desired delay amount is generated, if the modulation current increases, the delay change amount of the bias current per each gray scale decreases. That is, by controlling the modulation current, it is possible to control the delay resolution of the delay circuit 30.

Figure 6:
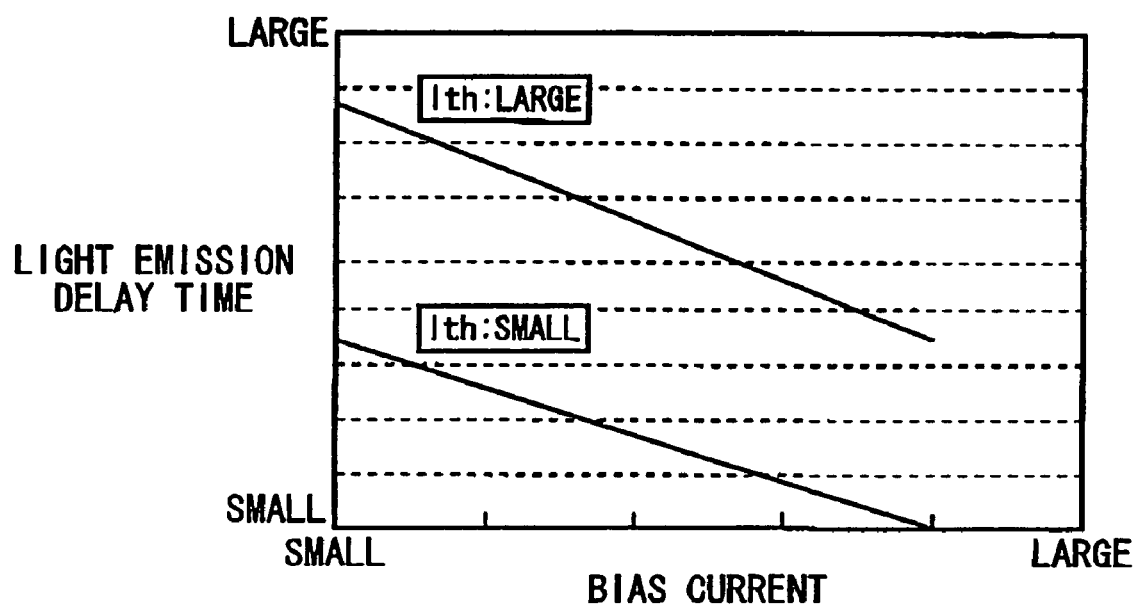
FIG. 6 shows the relation between the bias current and the light emission threshold current of the light emitting element and the light emission delay time.

FIG. 6 shows the relation between the bias current and the light emission threshold current of the light emitting element 32 and the light emission delay time. In FIG. 6, the horizontal axis represents the bias current, and the vertical axis represents the light emission delay time. As shown in FIG. 6, if the bias current changes in the same range, when the light emission threshold current $I_{th}$ increases, the variable range of the light emission delay time of the light emitting element 32 shifts in the increase direction. In other words, by controlling the light emission threshold current $I_{th}$ of the light emitting element 32, it is possible to control the variable range of the light emission delay time of the light emitting element 32. The delay circuit 30 described in connection with FIG. 2 controls the temperature of the light emitting element 32, the light emission threshold current of the light emitting element 32 and the variable delay range of the delay circuit 30.

Figure 7:
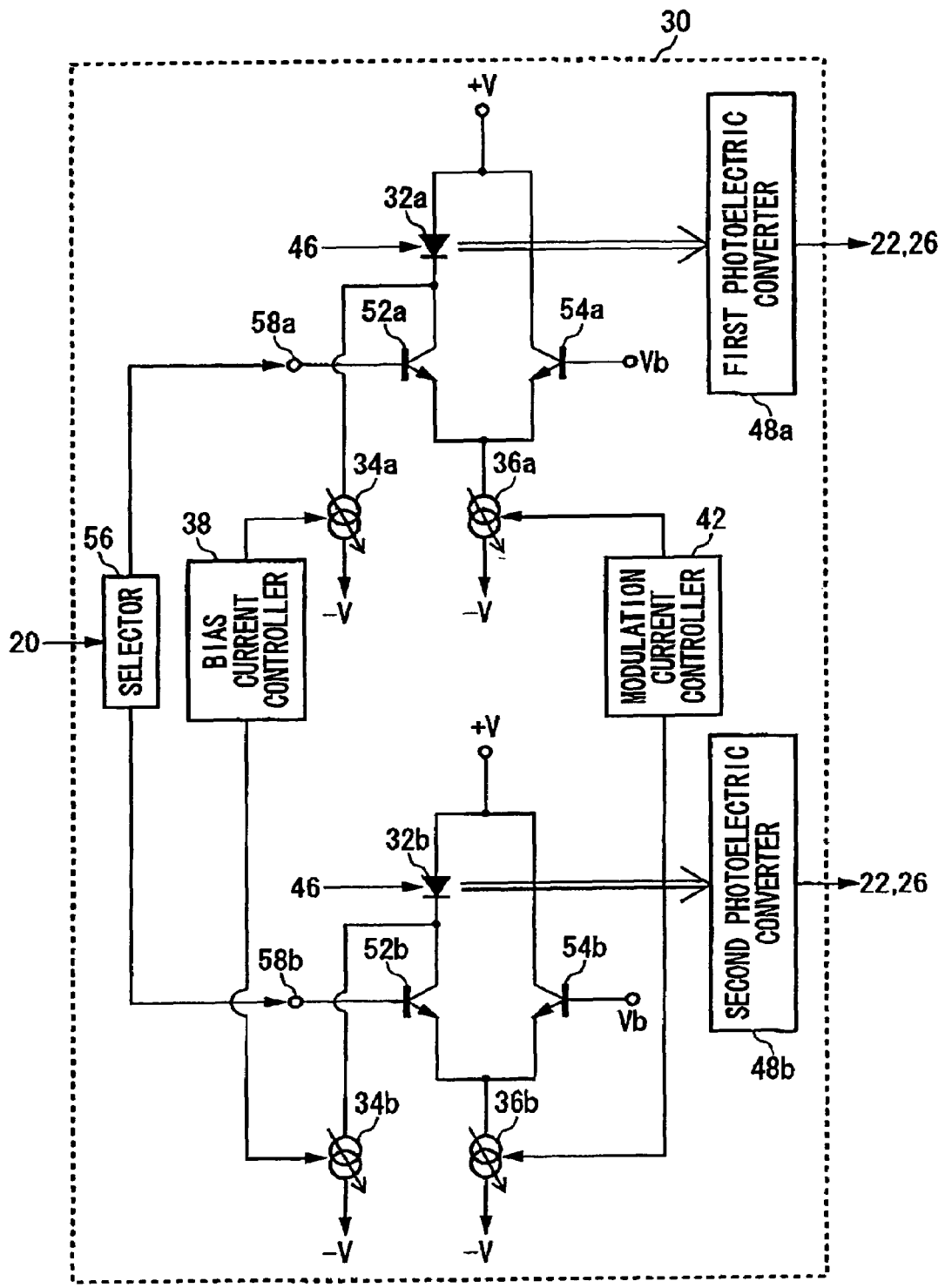
FIG. 7 shows another example of the configuration of the delay circuit.

FIG. 7 shows another example of the configuration of the delay circuit 30. The delay circuit 30 is provided with a plurality of light emitting elements 32, a plurality of bias current sources 34, a plurality of modulation current sources 36, a bias current controller 38, a modulation current controller 42, a temperature controller 46, a plurality of photoelectric converters 48, a plurality of transistors (52, 54), and a selector 56. In FIG. 7, the matters given the same symbols as those in FIG. 2 have the same or similar function and configuration as those described in connection with FIG. 2. In this embodiment, the delay circuit 30 is provided with a first light emitting element 32a, a second light emitting element 32b, a first bias current source 34a, a second bias current source 34b, a first photoelectric converter 48a, a second photoelectric converter 48b, a first transistor 52a, a second transistor 52b, a third transistor 54a, and a fourth transistor 54b.

The first and second light emitting elements 32a and 32b have the same or similar function and configuration as the light emitting element 32 described in connection with FIG. 2. The second light emitting element 32b has an interband transition time constant $\tau_n$ different from that of the first light emitting element 32a.

The first and second bias current sources 34a and 34b have the same or similar function and configuration as the bias current source 34 described in connection with FIG. 2. The first and second bias current sources 34a and 34b supply in advance the corresponding light emitting element 32 with the bias current smaller than the light emission threshold current of the corresponding light emitting element 32.

The first and second modulation current sources 36a and 36b have the same or similar function and configuration as the modulation current source 36 described in connection with FIG. 2. The first and second modulation current sources 36a and 36b supply the corresponding light emitting element 32 with the modulation current according to the input signal. The first and second photoelectric converters 48a and 48b have the same or similar function and configuration as the photoelectric converter 48 described in connection with FIG. 2.

The selector 56 selects either the first or second light emitting element 32a or 32b to be supplied with the input signal based on a desired delay time of the delay circuit 30. In this embodiment, the selector 56 selects either the first or second light emitting element 32a or 32b to be supplied with the modulation current based on the input signal. The selector 56 supplies the input signal to the base terminal 58 of the transistor 52 corresponding to the light emitting element 32 selected. The first and second light emitting elements 32a and 32b have their interband transition time constants $\tau_n$ different from each other. Accordingly, as described later in connection with FIG. 9, the delay resolution and the variable delay range of the first light emitting element 32a are different from those of the second light emitting element 32b.

The selector 56 selects either of the light emitting elements 32 to be supplied with the input signal based on the delay resolution and/or the variable delay range of the delay time of the delay circuit 30. The selector 56 may include a characteristics table memory for storing a characteristics table which indicates the delay resolution and the delay range for each of the light emitting elements 32. The selector 56 selects either of the light emitting elements 32 to be supplied with the input signal based on the characteristics table. According to the delay circuit 30 of this embodiment, it is possible to easily generate the delay of desired resolution. In addition, it is possible to easily generate the delay of a wide variable delay range.

FIG. 8 shows an example of the characteristics table. The characteristics table memory stores the characteristics table as shown in FIG. 8. The characteristics table indicates the delay resolution and the proper delay range of each of the plurality of light emitting elements 32.

Figure 9:
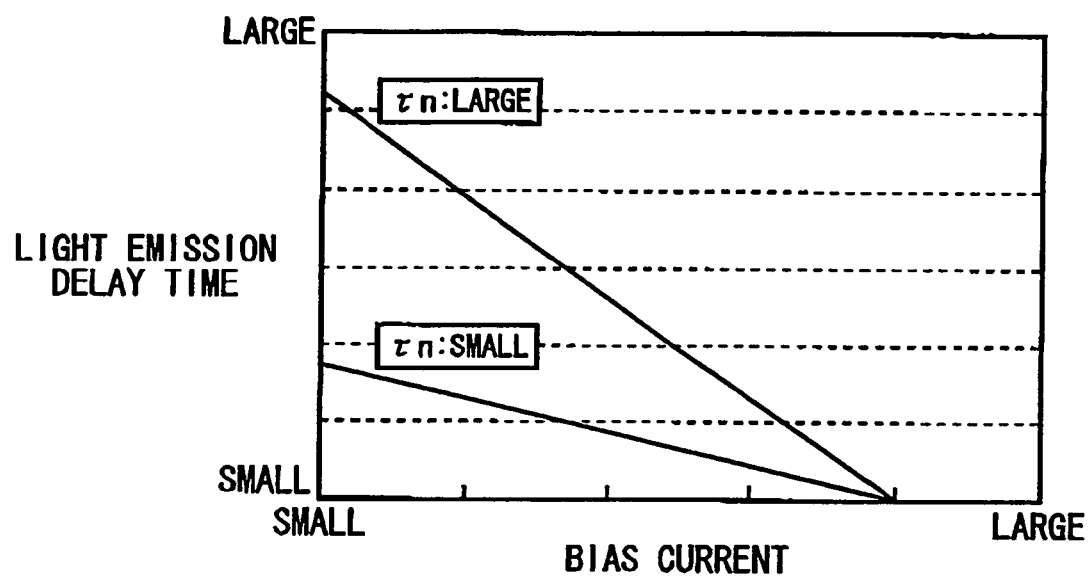
FIG. 9 shows the relation between the bias current and an interband transition time constant $\tau_n$ of the light emitting element and the light emission delay time.

FIG. 9 shows the relation between the bias current and the interband transition time constant $\tau_n$ of the light emitting element 32 and the light emission delay time. In FIG. 9, the horizontal axis represents the bias current, and the vertical axis represents the light emission delay time. In the delay circuit 30 described in connection with FIG. 7, by selecting either of the light emitting elements 32 whose interband transition time constants $\tau_n$ are different, the delay of desired delay resolution and a desired variable delay range is generated. As shown in FIG. 9, if the interband transition time constant $\tau_n$ is large, the variable delay range of the light emitting element 32 increases. And in case that the bias current is changed with a predetermined gray scale and a desired delay amount is generated, if the interband transition time constant becomes large, the delay change amount of the bias current per each gray scale increases. That is, by selecting either of the light emitting elements 32 whose interband transition time constants $\tau_n$ are different, it is possible to control the delay resolution and the variable delay range of the delay circuit 30.

Although the present invention has been described by way of exemplary embodiments, it should be understood that those skilled in the art might make many changes and substitutions without departing from the spirit and the scope of the present invention, which is defined only by the appended claims.

And although the delay circuit included in the test apparatus has been described as an exemplary embodiment in the above embodiment, it is apparent that this invention is not limited to the test apparatus. For example, it is obvious that this invention can be applied to various apparatuses such as a timing generator, a communication apparatus, a computer, a timer, etc.

As obvious from the description above, according to the delay circuit related to the present invention, it is possible to easily generate a desired delay. In addition, it is possible to easily generate a delay of desired delay resolution and a desired variable delay range. Further, according to the test apparatus related to the present invention, it is possible to easily perform the test of an electronic device.

What is claimed is:

1. A delay circuit for outputting a delay signal, which results from delaying an input signal by a desired time, comprising:
   a first light emitting element for emitting light according to said input signal and outputting a light emission signal as said delay signal;
   a first bias current source for supplying said first light emitting element with a bias current, which is smaller than a light emission threshold current whereby said first light emitting element starts to emit light, a modulation current source for supplying said first light emitting element with a modulation current to make said first light emitting element emit light according to said input signal; and a modulation current controller for controlling said modulation current of said modulation current source based on a delay resolution of said delay circuit.

2. A delay circuit as claimed in claim 1, wherein said modulation current controller controls said modulation current of said modulation current source further based on a variable delay range of said delay circuit.

3. A delay circuit for outputting a delay signal, which results from delaying an input signal by a desired time, comprising:

a first light emitting element for emitting light according to said input signal and outputting a light emission signal as said delay signal;

a first bias current source for supplying said first light emitting element with a bias current, which is smaller than a light emission threshold current whereby said first light emitting element starts to emit light; and a bias current controller for controlling said bias current of said bias current source based on said desired time, wherein said bias current controller controls said bias current of said bias current source further based on a temperature of said first light emitting element.

4. A delay circuit for outputting a delay signal, which results from delaying an input signal by a desired time, comprising:

a first light emitting element for emitting light according to said input signal and outputting a light emission signal as said delay signal;

a first bias current source for supplying said first light emitting element with a bias current, which is smaller than a light emission threshold current whereby said first light emitting element starts to emit light; and a temperature controller for heating or cooling said first light emitting element.

5. A delay circuit as claimed in claim 4, wherein said temperature controller heats or cools said first light emitting element based on a variable delay range of said delay circuit.

6. A delay circuit as claimed in claim 2, further comprising: a photoelectric converter for converting said light emission signal outputted by said first light emitting element in to an electrical signal and outputting said electrical signal as said delay signal.

7. A delay circuit for outputting a delay signal, which results from delaying an input signal by a desired time, comprising:

a first light emitting element for emitting light according to said input signal and outputting a light emission signal as said delay signal;

a first bias current source for supplying said first light emitting element with a bias current, which is smaller than a light emission threshold current whereby said first light emitting element starts to emit light;

a second light emitting element, whose interband transition time constant is different from said first light emitting element, for emitting light according to said input signal and outputting a light emission signal as said delay signal;

a second bias current source for supplying said second light emitting element with a bias current, which is smaller than a light emission threshold current whereby said second light emitting element starts to emit light; and a selector for supplying said input signal to either said first or second light emitting element based on said desired time.

8. A delay circuit as claimed in claim 7, wherein said first and second light emitting elements are laser diodes, and base materials of said first and second light emitting elements are different.

9. A test apparatus for testing an electronic device, comprising:

a pattern generator for generating a test signal to test said electronic device;

a wave form formatter for supplying said electronic device with a signal, which results from formatting said test signal;

a timing generator for generating a desired timing signal;

a sampler for sampling an output signal outputted by said electronic device based on said test signal at timing of said desired timing signal generated by said timing generator; and a judgment unit for judging quality of said electronic device based on a sampling result of said sampler, wherein said timing generator comprises:

a delay circuit for outputting a delay signal, which results from delaying a reference clock by a desired time, as said desired timing signal, and said delay circuit comprises:

a first light emitting element for emitting light according to said reference clock and outputting a light emission signal as said delay signal;

a bias current source for supplying said light emitting element with a bias current, which is smaller than a light emission threshold current whereby said first light emitting element starts to emit light;

a modulation current source for supplying said first light emitting element with a modulation current to make said first light emitting element emit light according to said input signal; and a modulation current controller for controlling said modulation current of said modulation current source based on a delay resolution of said delay circuit.

10. The delay circuit as claimed in claim 9, wherein said modulation current controller controls said modulation current of said modulation current source further based on a variable delay range of said delay circuit.

11. A test apparatus for testing an electronic device, comprising:

a pattern generator for generating a test signal to test said electronic device;

a wave form formatter for supplying said electronic device with a signal, which results from formatting said test signal;

a timing generator for generating a desired timing signal;

a sampler for sampling an output signal outputted by said electronic device based on said test signal at timing of said desired timing signal generated by said timing generator; and a judgment unit for judging quality of said electronic device based on a sampling result of said sampler, wherein said timing generator comprises:

a delay circuit for outputting a delay signal, which results from delaying a reference clock by a desired time, as said desired timing signal, and said delay circuit comprises:

a first light emitting element for emitting light according to said reference clock and outputting a light emission signal as said delay signal;

a bias current source for supplying said light emitting element with a bias current, which is smaller than a light emission threshold current whereby said first light emitting element starts to emit light;

a modulation current source for supplying said first light emitting element with a modulation current to make said first light emitting element emit light according to said input signal;

a modulation current controller for controlling said modulation current of said modulation current source based on a delay resolution of said delay circuit; and a bias current controller for controlling said bias current of said bias current source based on said desired time, wherein said bias current controller controls said bias current of said bias current source further based on a temperature of said first light emitting element.

12. A test apparatus for testing an electronic device, comprising:

a pattern generator for generating a test signal to test said electronic device;

a wave form formatter for supplying said electronic device with a signal, which results from formatting said test signal;

a timing generator for generating a desired timing signal;

a sampler for sampling an output signal outputted by said electronic device based on said test signal at timing of said desired timing signal generated by said timing generator; and a judgment unit for judging quality of said electronic device based on a sampling result of said sampler, wherein said timing generator comprises:

a reference clock generator for generating a reference clock; and a delay circuit for outputting a delay signal, which results from delaying said reference clock by a desired time, as said desired timing signal, and said delay circuit comprises:

a first light emitting element for emitting light according to said reference clock and outputting a light emission signal as said delay signal;

a bias current source for supplying said light emitting element with a bias current, which is smaller than a light emission threshold current whereby said first light emitting element starts to emit light;

a temperature controller for heating or cooling said first light emitting element.

13. A test apparatus for testing an electronic device, comprising:

a pattern generator for generating a test signal to test said electronic device;

a wave form formatter for supplying said electronic device with a signal, which results from formatting said test signal;

a timing generator for generating a desired timing signal;

a sampler for sampling an output signal outputted by said electronic device based on said test signal at timing of said desired timing signal generated by said timing generator; and a judgment unit for judging quality of said electronic device based on a sampling result of said sampler, wherein said timing generator comprises:

a delay circuit for outputting a delay signal, which results from delaying said reference clock by a desired time, as said desired timing signal, and said delay circuit comprises:

a first light emitting element for emitting light according to said reference clock and outputting a light emission signal as said delay signal;

a first bias current source for supplying said light emitting element with a bias current, which is smaller than a light emission threshold current whereby said first light emitting element starts to emit light;

a second light emitting element, whose interband transition time constant is different from said first light emitting element, for emitting light according to said input signal and outputting a light emission signal as said delay signal;

a second bias current source for supplying said second light emitting element with a bias current, which is smaller than a light emission threshold current whereby said second light emitting element starts to emit light; and a selector for supplying said input signal to either said first or second light emitting element based on said desired time.

* * * * *

UNITED STATES PATENT AND TRADEMARK OFFICE
CERTIFICATE OF CORRECTION

| | |
|---|---|
| PATENT NO. | : 7,339,152 B2 |
| APPLICATION NO. | : 10/887760 |
| DATED | : March 4, 2008 |
| INVENTOR(S) | : Daisuke Watanabe |

It is certified that error appears in the above-identified patent and that said Letters Patent is hereby corrected as shown below:

In the Claims:

In Claim 6, column 9, line 44, after the word "claim", the number "2" should be --1--.

Signed and Sealed this

First Day of July, 2008

JON W. DUDAS
*Director of the United States Patent and Trademark Office*